US012562684B2

(12) United States Patent
Wada et al.

(10) Patent No.: US 12,562,684 B2
(45) Date of Patent:     Feb. 24, 2026

(54) OSCILLATOR

(71) Applicant: SEIKO EPSON CORPORATION, Tokyo (JP)

(72) Inventors: Ryuto Wada, Minowa (JP); Masaaki Okubo, Minowa (JP)

(73) Assignee: SEIKO EPSON CORPORATION (JP)

( * ) Notice: Subject to any disclaimer, the term of this patent is extended or adjusted under 35 U.S.C. 154(b) by 43 days.

(21) Appl. No.: 18/642,874

(22) Filed: Apr. 23, 2024

(65) Prior Publication Data

US 2024/0356490 A1     Oct. 24, 2024

(30) Foreign Application Priority Data

Apr. 24, 2023     (JP) ................................. 2023-070712

(51) Int. Cl.
| | |
|---|---|
| *H03B 5/32* | (2006.01) |
| *H01L 23/00* | (2006.01) |
| *H03B 5/04* | (2006.01) |

(52) U.S. Cl.
CPC .............. *H03B 5/32* (2013.01); *H01L 24/45* (2013.01); *H01L 24/48* (2013.01); *H03B 5/04* (2013.01); *H01L 2224/45144* (2013.01); *H01L 2924/351* (2013.01); *H03B 2200/0018* (2013.01)

(58) Field of Classification Search
CPC ....................................................... H03B 5/32
USPC ........................................................ 331/158
See application file for complete search history.

(56) References Cited

U.S. PATENT DOCUMENTS

| | | | |
|---|---|---|---|
| 2018/0234052 A1* | 8/2018 | Noto | .................... H03H 9/0552 |
| 2019/0035848 A1* | 1/2019 | Tanaka | ................... H03H 9/205 |
| 2023/0065998 A1 | 3/2023 | Isohata | |

FOREIGN PATENT DOCUMENTS

JP             2023-031988 A     3/2023

* cited by examiner

*Primary Examiner* — Joseph Chang
(74) *Attorney, Agent, or Firm* — Harness, Dickey & Pierce, P.L.C.

(57)             ABSTRACT

An oscillator includes a resonator element provided with an excitation electrode, an oscillation circuit for oscillating the resonator element to generate an oscillation signal, a temperature sensor for generating a temperature signal for temperature compensation of the oscillation signal, a temperature control element for controlling temperature of the resonator element, and a container that houses the resonator element, the oscillation circuit, the temperature sensor, and the temperature control element, in which the temperature sensor and the temperature control element overlap the excitation electrode in plan view.

7 Claims, 13 Drawing Sheets

OSCILLATOR

The present application is based on, and claims priority from JP Application Serial Number 2023-070712, filed Apr. 24, 2023, the disclosure of which is hereby incorporated by reference herein in its entirety.

BACKGROUND

1. Technical Field

The present disclosure relates to an oscillator.

2. Related Art

A thermostatic chamber integrated quartz crystal oscillator is known in which a crystal device is disposed in a small thermostatic chamber to increase frequency stability with respect to a change in temperature of the quartz crystal oscillator.

For example, JP-A-2023-031988 discloses an oscillator having a structure in which a container housing a first resonator element and a temperature control element is mounted on one principal surface of a substrate, a second resonator element is mounted on the other principal surface of the substrate, and a leg portion is provided so as to surround the second resonator element.

In the oscillator, the temperature control element including a heat generation circuit and a circuit element including an oscillation circuit are formed separately in the container.

However, the oscillation frequency stability of the oscillator of JP-A-2023-031988 may be reduced. Specifically, since the temperature control element including the heat generation circuit and the circuit element are formed separately, heat from the heat generation circuit is released as radiant heat, so that the heat may be insufficiently transferred to the circuit element to reduce the frequency stability.

SUMMARY

An oscillator of an aspect according to the present application includes a resonator element provided with an excitation electrode, an oscillation circuit for oscillating the resonator element to generate an oscillation signal, a temperature sensor for generating a temperature signal for temperature compensation of the oscillation signal, a temperature control element for controlling temperature of the resonator element, and a container that houses the resonator element, the oscillation circuit, the temperature sensor, and the temperature control element, in which the temperature sensor and the temperature control element overlap the excitation electrode in plan view.

BRIEF DESCRIPTION OF THE DRAWINGS

FIG. 7 is a sectional view of a voltage controlled quartz crystal oscillator.

FIG. 11 is a sectional view of an inner package according to Embodiment 2.

DESCRIPTION OF EMBODIMENTS

Embodiment 1

Configuration of Oscillator

Figure 1:
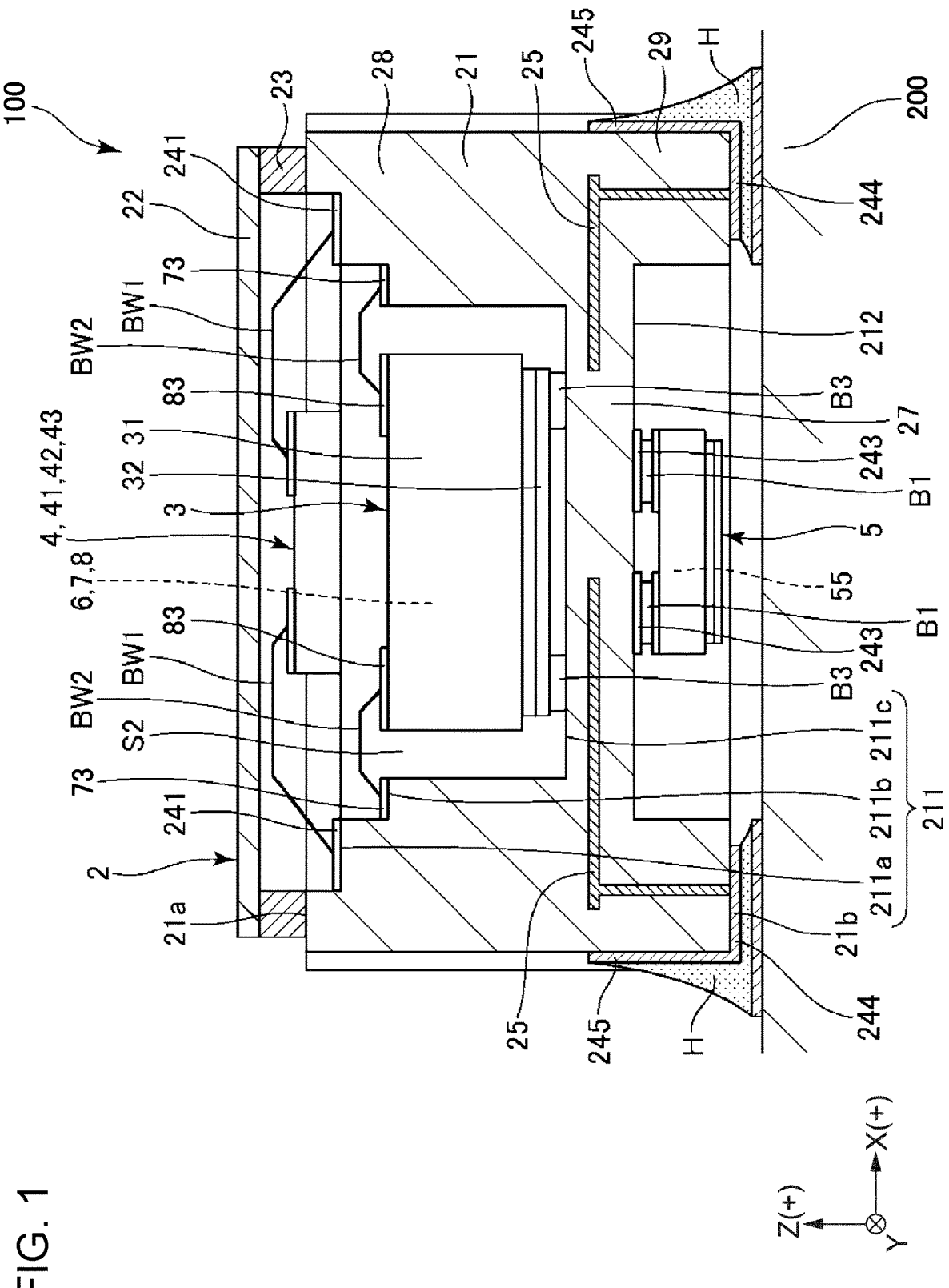
FIG. 1 is a sectional view of an oscillator according to Embodiment 1.
Figure 2:
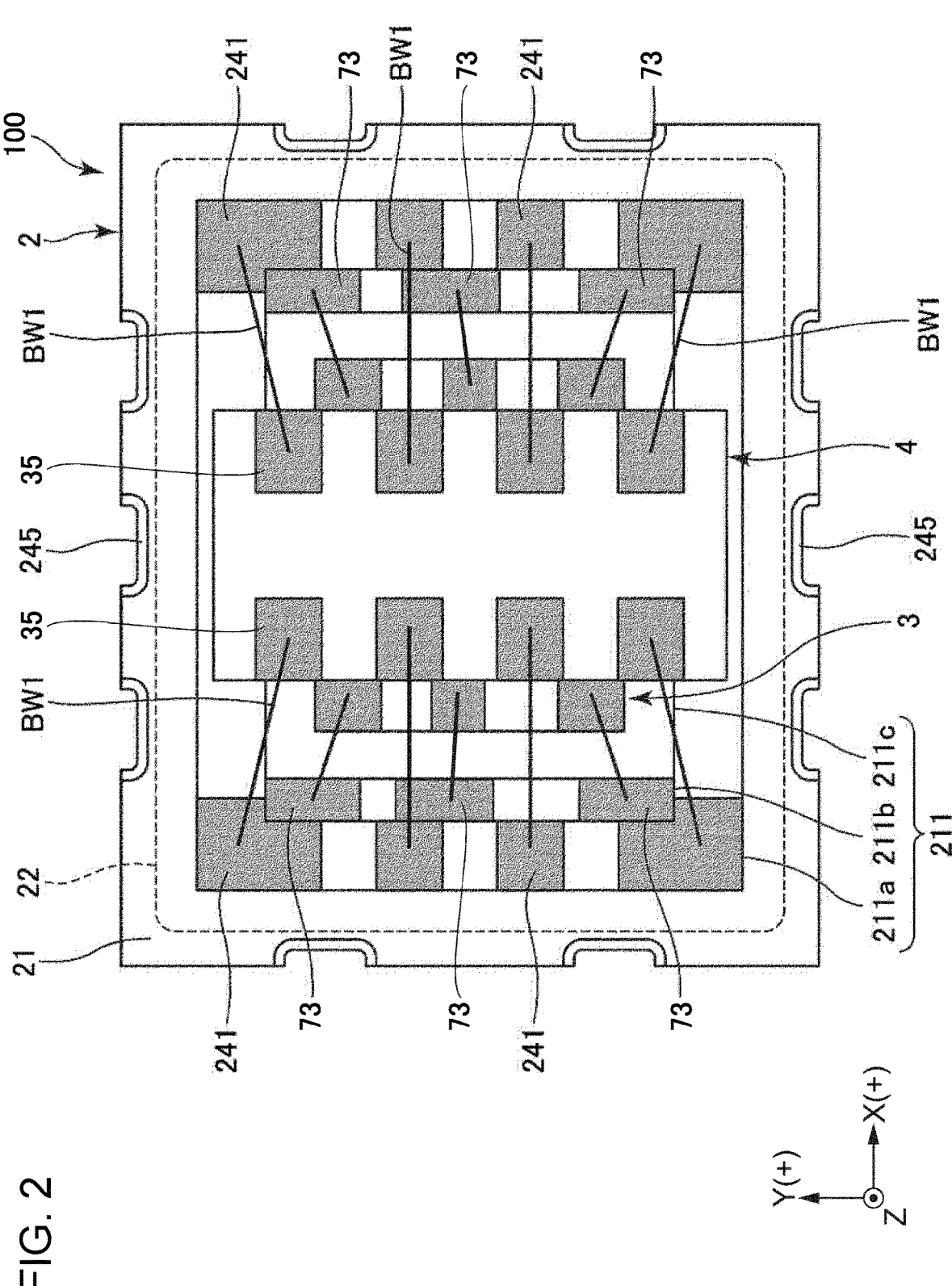
FIG. 2 is a plan view of the oscillator.

FIG. 1 is a sectional view of an oscillator. FIG. 2 is a plan view of the oscillator.

As illustrated in FIG. 2, an oscillator 100 of the present embodiment is a surface mounting device of a box shape having a substantially rectangular shape in plan view. To illustrate an inner structure of the oscillator 100, the oscillator 100 illustrated in FIG. 2 is in a state where an outer lid 22 (FIG. 1) is removed. Each figure represents the X axis, the Y axis, and the Z axis as three axes orthogonal to each other. In the present embodiment, an extending direction of a long side of the oscillator 100 having a rectangular shape is defined as a positive X direction, an extending direction of a short side is defined as a positive Y direction, and a thickness direction of the oscillator 100 is defined as a positive Z direction. The positive Z direction is also referred to as an upper side, and the negative Z direction is also referred to as a lower side. The positive X direction and the negative X direction are collectively referred to also as the X-axis direction. The same applies to the Y axis and the Z axis.

The oscillator 100 illustrated in FIGS. 1 and 2 is an oven-controlled crystal oscillator (OCXO) in which an inner package 3 and a control IC 4 are housed in an outer package 2 and a voltage controlled quartz crystal oscillator 5 is provided on a rear surface of the outer package 2.

The inner package 3 is a container and houses a resonator element 6 as a first resonator element, a second integrated circuit 8, and a first integrated circuit 7.

The voltage controlled quartz crystal oscillator 5 includes a resonator element 55 as a second resonator element.

The outer package 2 is an outer container and has an outer base 21 and the outer lid 22. The outer base 21 has a box shape and has an upper recess 211 that is open on an upper surface 21*a* and a lower recess 212 that is open on a lower surface 21*b*. Thus, the outer base 21 has a substantially H shape in sectional view. In other words, the outer base 21 has a substrate 27, a wall portion 28 of a frame shape erected upward from an edge of an upper surface of the substrate 27, and a leg portion 29 of a frame shape erected downward from an edge of a lower surface of the substrate 27.

The outer lid 22 has a plate shape and is bonded to the upper surface 21*a* of the outer base 21 via a sealing member 23 such as a seal ring or low-melting-point glass so as to close the opening of the upper recess 211. The upper recess 211 is thereby airtightly sealed, and an outer housing space S2 as a housing space is formed in the outer package 2. The outer housing space S2 is made airtight and set in a reduced-pressure state, desirably, in a state approximate to a vacuum state. Thus, a thermal insulating property of the outer package 2 is enhanced, and the oscillator 100 is less likely to be affected by ambient temperature. Meanwhile, the opening of the lower recess 212 is not sealed, but is exposed on the outside of the outer package 2.

The inner package 3 and the control IC 4 are housed in the outer housing space S2.

The voltage controlled quartz crystal oscillator 5 is mounted on the lower recess 212.

Note that constituent materials of the outer base 21 and the outer lid 22 are not particularly limited, but it is desirable that, for example, the outer base 21 be formed of a variety of ceramic materials such as alumina or titania, and the outer lid 22 be formed of a variety of metal materials such as Kovar. Thus, the outer package 2 is made tough and excellent in mechanical strength. Further, it is possible to make the both components approximately equal in linear expansion coefficient, and it is also possible to achieve reduction in thermal stress caused in the outer package 2.

With such a configuration, it becomes difficult for the stress to be applied to the resonator elements 6 and 55, and thus, the vibration characteristics of the resonator elements 6 and 55 stabilize.

In the outer housing space S2, the upper recess 211 has a first upper recess 211a that is open on the upper surface 21a, a second upper recess 211b that is open on a bottom surface of the first upper recess 211a and is smaller in opening than the first upper recess 211a, and a third upper recess 211c that is open on a bottom surface of the second upper recess 211b and is smaller in opening than the second upper recess 211b.

The inner package 3 is disposed on a bottom surface of the third upper recess 211c. Above the inner package 3, the control IC 4 is disposed in the first upper recess 211a so as to extend across the inner package 3.

As illustrated in FIG. 2, the control IC 4 has a rectangular shape having a long side extending in the Y-axis direction and is disposed like a viaduct so as to extend across the inner package 3 with two short-side portions mounted on the first upper recess 211a of a frame shape surrounding the third upper recess 211c.

The first upper recess 211a includes a plurality of terminals 241. Each of the terminals 241 is electrically coupled to a corresponding one of terminals 35 of the control IC 4 via a bonding wire BW1. An Au wire is desirably used as the bonding wire BW1. Note that an aluminum wire may be used. The same applies to bonding wires described later.

Figure 3:
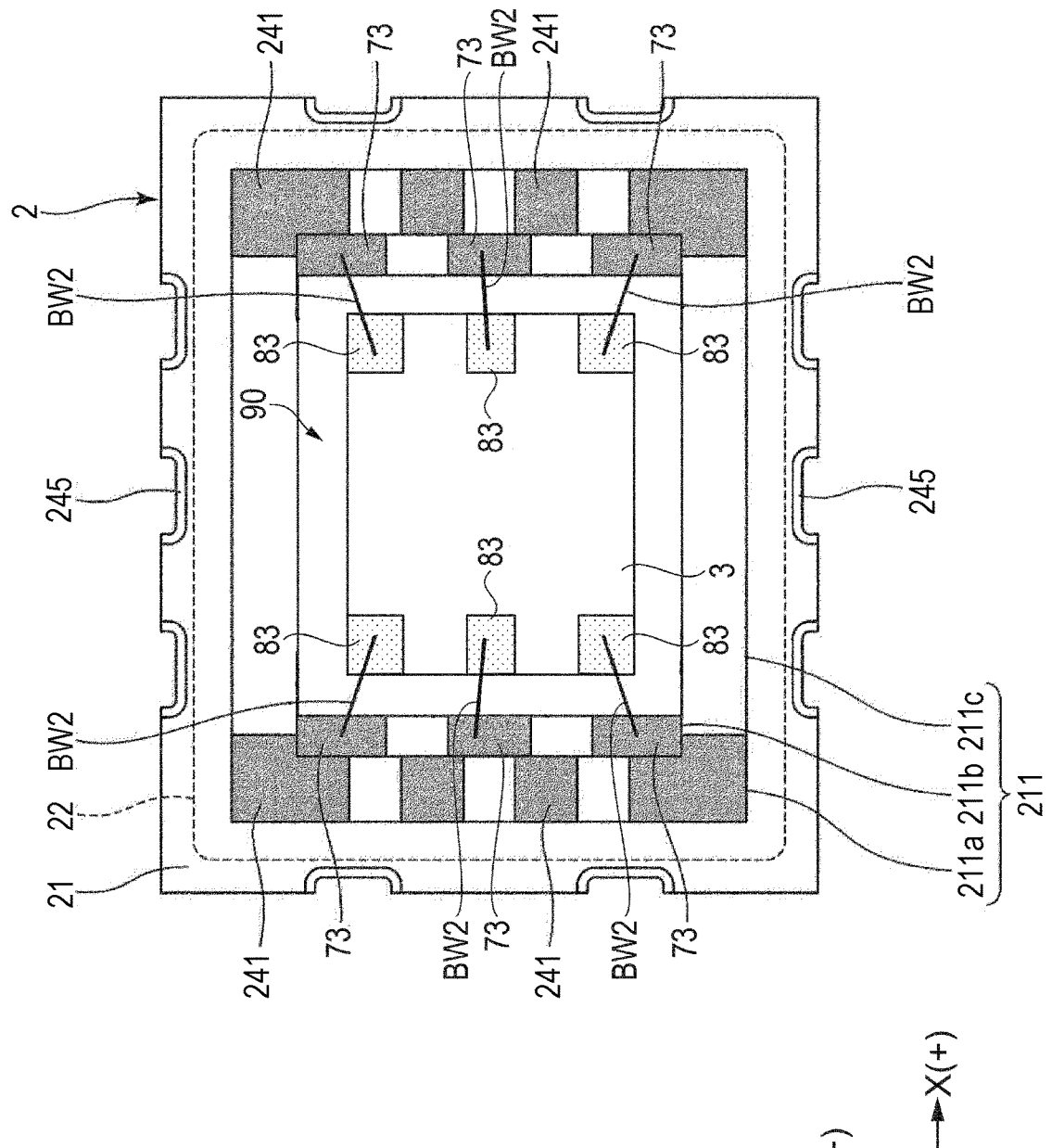
FIG. 3 is a plan view of an inner package.

FIG. 3 is a plan view of the inner package and corresponds to FIG. 2. FIG. 3 illustrates a mounting status of the inner package 3 before the control IC 4 is mounted.

The second upper recess 211b includes a plurality of terminals 73. A plurality of terminals 83 are provided on a mounting surface 90 serving as an upper surface of the inner package 3.

Each of the terminals 73 on the second upper recess 211b is electrically coupled to a corresponding one of the terminals 83 of the inner package 3 via a bonding wire BW2.

Description will be given with reference back to FIG. 1.

As illustrated in FIG. 1, a plurality of internal terminals 243 are provided on a bottom surface of the lower recess 212 in the outer base 21. Each of the internal terminals 243 is electrically coupled to the voltage controlled quartz crystal oscillator 5 via a bonding member B1 having electrical conductivity. A plurality of external terminals 244 for mounting are provided on a bottom surface of the leg portion 29 of the outer base 21.

The terminals 241, the terminals 73, the internal terminals 243, and the external terminals 244 are electrically coupled via interconnections 25 formed in the outer base 21 to electrically couple the control IC 4, the inner package 3, and the voltage controlled quartz crystal oscillator 5. By forming the interconnections 25 in such a manner so as not to be exposed on the outside of the outer package 2, the oscillator 100 is less likely to be affected by a disturbance such as a radiation noise or an electromagnetic field. Accordingly, the oscillator 100 is able to exert excellent phase noise characteristics.

The oscillator 100 is electrically coupled to an external device 200 via the external terminal 244. In particular, in the present embodiment, a side surface terminal 245 coupled to the external terminal 244 is arranged on a side surface of the leg portion 29. The side surface terminal 245 is a castellation. Accordingly, solder H spreads wetting the side surface terminal 245 to form a fillet to make the mechanical and electrical bonding to the external device 200 stronger. However, this is not a limitation, and, for example, the side surface terminal 245 may be omitted.

Configuration of Inner Package

Figure 4:
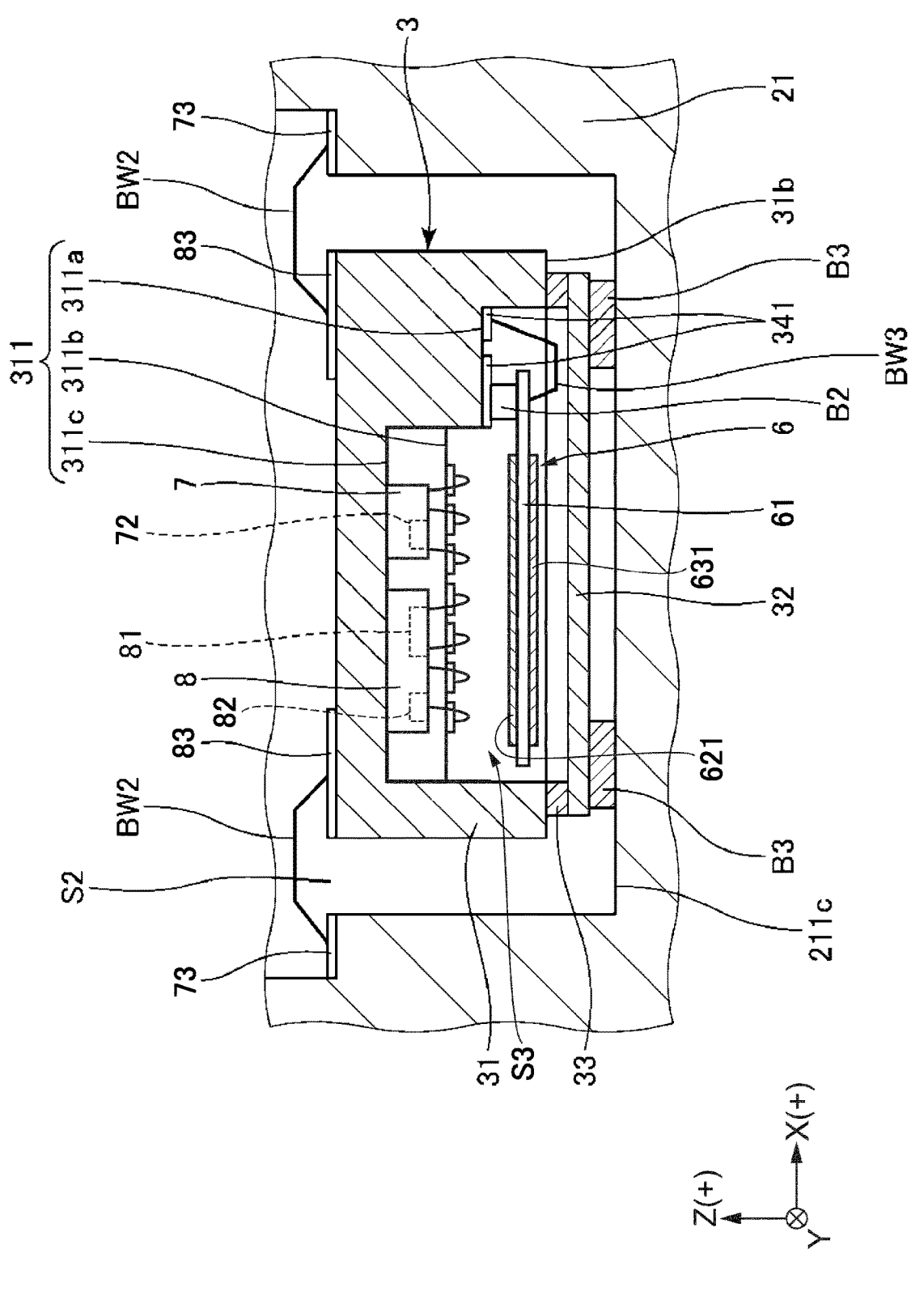
FIG. 4 is a sectional view of the inner package.

FIG. 4 is a sectional view of the inner package and corresponds to FIG. 1.

As illustrated in FIG. 4, the inner package 3 has an inner base 31 and an inner lid 32. The inner base 31 has a box shape and has a recess 311 that is open on a lower surface 31b. The inner lid 32 has a plate shape and is bonded to the lower surface 31b of the inner base 31 via a sealing member 33 such as a seal ring or low-melting-point glass so as to close the opening of the recess 311. The recess 311 is thereby airtightly sealed, and an inner housing space S3 is formed in the inner package 3. The inner housing space S3 houses the resonator element 6, the first integrated circuit 7, and the second integrated circuit 8.

The inner package 3 is fixed to a bottom surface of the third upper recess 211c of the outer base 21 via a bonding member B3 formed of, for example, a silicone resin. Note that the bonding member B3 is not limited to a silicone resin and is required only to be a bonding member having an insulating property and low thermal conductivity. For example, a variety of resin materials such as an epoxy resin may be used.

According to such a configuration, since the inner package 3 and the outer package 2 are thermally insulated from each other by the bonding member B3, it becomes difficult for the heat of the first integrated circuit 7 to be released to the outside via the outer package 2.

Although constituent materials of the inner base 31 and the inner lid 32 are not particularly limited, for example, the inner base 31 may be formed of a variety of ceramic materials such as alumina or titania, and the inner lid 32 may be formed of a variety of metal materials such as Kovar. Thus, the inner package 3 is made tough and excellent in mechanical strength. Further, it is possible to make the both components approximately equal in linear expansion coefficient, and it is also possible to achieve reduction in thermal stress caused in the inner package 3. Accordingly, it becomes difficult for the stress to be applied to the resonator element 6, and thus, the vibration characteristics of the resonator element 6 stabilize.

The recess 311 has a first recess 311a that is open on the lower surface 31b, a second recess 311b that is open on a bottom surface of the first recess 311a and is smaller in opening than the first recess 311a, and a third recess 311c that is open on a bottom surface of the second recess 311b and is smaller in opening than the second recess 311b.

The resonator element 6 is mounted on the bottom surface of the first recess 311a. The first integrated circuit 7 and the second integrated circuit 8 are arranged side by side in the X-axis direction on a bottom surface of the third recess 311*c*.

Figure 5:
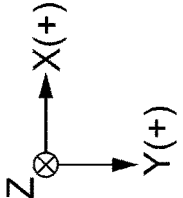
FIG. 5 is a plan view of an interior of the inner package before a resonator element is mounted.
Figure 6:
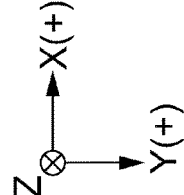
FIG. 6 is a plan view of an interior of the inner package after the resonator element is mounted.

FIG. 5 is a plan view of an interior of the inner package before the resonator element is mounted. FIG. 6 is a plan view of an interior of the inner package after the resonator element is mounted.

As illustrated in FIG. 5, the first integrated circuit 7 and the second integrated circuit 8 are arranged side by side in the third recess 311*c*.

The first integrated circuit 7 has a heat generation circuit 72 as a temperature control element. The heat generation circuit 72 is a heater circuit and functions as a heat generation portion that heats the resonator element 6. The first integrated circuit 7 is arranged on the bottom surface of the third recess 311*c* with an active surface facing downward (toward the inner lid 32 side).

The second integrated circuit 8 is an integrated circuit including an oscillation circuit 81 and a temperature sensor 82.

The oscillation circuit 81 is an oscillation circuit for oscillating the resonator element 6 to output a reference frequency signal. The temperature sensor 82 is a temperature sensor for detecting temperature of a peripheral portion including the second integrated circuit 8. The second integrated circuit 8 generates a temperature signal for temperature compensation of an oscillation signal based on the temperature detected by the temperature sensor 82 and transmits the signal to the control IC 4. Although details will be described later, the control IC 4 controls the heat generation circuit 72 of the first integrated circuit 7 based on the temperature signal of the temperature sensor 82 such that the temperature of the resonator element 6 is controlled to be kept at a constant temperature. The second integrated circuit 8 is arranged on the bottom surface of the third recess 311*c* with an active surface facing downward (toward the inner lid 32 side).

As illustrated in FIG. 5, the first integrated circuit 7 has a quadrangular shape, and the heat generation circuit 72 is provided along a side of the quadrangular shape on the second integrated circuit 8 side.

The second integrated circuit 8 has a quadrangular shape, and the oscillation circuit 81 is provided on the first integrated circuit 7 side at the center of the quadrangular shape. The temperature sensor 82 is provided in the vicinity of a side of the quadrangular shape opposite to the first integrated circuit 7.

The second recess 311*b* includes a plurality of terminals 342 and 343. Each of the terminals 342 is electrically coupled to the first integrated circuit 7 via a bonding wire BW4. In other words, the first integrated circuit 7 is electrically coupled to the inner package 3 as a container via the bonding wire BW4.

Each of the terminals 343 is electrically coupled to the second integrated circuit 8 via a bonding wire BW5.

As illustrated in FIGS. 4 and 6, the resonator element 6 is cantilever-supported with one end thereof fixed to the first recess 311*a*. For the resonator element 6, an SC cut quartz crystal resonator element is used in a suitable example.

As illustrated in FIG. 4, the resonator element 6 has a quartz crystal substrate 61 which is cut out as an SC cut element and has a quadrangular shape in plan view, an excitation electrode 621 arranged on a surface of the quartz crystal substrate 61 in the positive Z direction, and an excitation electrode 631 arranged on a surface of the quartz crystal substrate 61 in the negative Z direction. The excitation electrodes 621 and 631 are arranged opposed to each other on front and rear surfaces of the quartz crystal substrate 61.

As illustrated in FIG. 6, in a suitable example, the excitation electrodes 621 and 631 have a quadrangular shape and the same size. In a suitable example, the excitation electrodes 621 and 631 are Au electrodes. Note that the excitation electrodes 621 and 631 are not limited to Au electrodes and may be any metal electrodes. Examples thereof include Ag electrodes and platinum electrodes.

As illustrated in FIG. 6, a pad electrode 622 is provided so as to extend from the excitation electrode 621 to an end of the quartz crystal substrate 61. Similarly, a pad electrode 632 is provided so as to extend from the excitation electrode 631 to the end of the quartz crystal substrate 61.

As illustrated in FIG. 6, the first recess 311*a* includes two terminals 341. The pad electrode 622 of the resonator element 6 is electrically coupled to one of the terminals 341 via a bonding member B2. The pad electrode 632 of the resonator element 6 is electrically coupled to the other terminal 341 via a bonding wire BW3.

As illustrated in FIG. 6, in a suitable example, the first integrated circuit 7 and the second integrated circuit 8 are entirely covered by the excitation electrodes 621 and 631. As illustrated in FIG. 4, the excitation electrodes 621 and 631 are arranged so as to become lids of the first integrated circuit 7 and the second integrated circuit 8 and therefore reflect radiant heat from both the integrated circuits. This makes it possible to suppress radiant heat from being released to the outside of the inner package 3. In particular, since the two layers of the excitation electrodes 621 and 631 composed of Au electrodes are provided via the quartz crystal substrate 61, a higher heat retaining effect is exhibited compared to a single-layer configuration, and it is possible to further suppress the radiant heat from being released to the outside. Accordingly, since a heat retaining property in the inner package 3 is improved, the temperature in the inner package 3 is able to be made uniform. This makes it possible to suppress a temperature variation in the first integrated circuit 7 and the second integrated circuit 8 and thus possible to achieve good frequency characteristics. Furthermore, the improved heat retaining property is able to reduce the amount of heat generated by the heat generation circuit 72 of the first integrated circuit 7, and it is thus possible to reduce electric current consumption.

Note that the configuration is not limited to such a configuration and may be such that the heat generation circuit 72 as a temperature control element and the temperature sensor 82 are covered by the excitation electrodes 621 and 631. In particular, by covering the heat generation circuit 72 serving as a heat generation source with the excitation electrodes 621 and 631, the heat retaining property is able to be enhanced. Even such a configuration is able to achieve a similar operation effect to the above-described effect.

In other words, the oscillator 100 includes the resonator element 6 provided with the excitation electrodes 621 and 631, the oscillation circuit 81 for oscillating the resonator element 6 to generate an oscillation signal, the temperature sensor 82 for generating a temperature signal for temperature compensation of the oscillation signal, the heat generation circuit 72 as a temperature control element for controlling temperature of the resonator element 6, and the inner package 3 as a container that houses these components. The temperature sensor 82 and the heat generation circuit 72 overlap the excitation electrodes 621 and 631 in plan view.

Alternatively, the temperature sensor 82 and the first integrated circuit 7 are entirely covered by the excitation electrodes 621 and 631.

As illustrated in FIG. 6, a distance L1 between the heat generation circuit 72 of the first integrated circuit 7 and the bonding member B2 and a distance L2 between the heat generation circuit 72 and the temperature sensor 82 of the second integrated circuit 8 are set to be substantially the same in plan view. In other words, the first integrated circuit 7 is arranged between the bonding member B2 and the second integrated circuit 8.

Accordingly, it is possible to approximate a dimension of a heat conduction path from the heat generation circuit 72 to the resonator element 6 and a dimension of a heat conduction path from the heat generation circuit 72 to the temperature sensor 82 to each other. Thus, since the temperature detected by the temperature sensor 82 becomes substantially the same as the temperature of the resonator element 6, it is possible to accurately detect the temperature of the resonator element 6.

Note that the foregoing description has been given by assuming that the heat generation circuit 72 and the temperature sensor 82 are covered by the two layers of the excitation electrodes 621 and 631, a configuration including any one of the layers may be employed. Even such a configuration is able to improve the heat retaining property in the inner package 3.

The resonator element is not limited to an SC cut quartz crystal resonator element. Other piezoelectric resonator elements such as an AT cut quartz crystal resonator element, a BT cut quartz crystal resonator element, a tuning fork type quartz crystal resonator element, and a surface acoustic wave resonator, an MEMS resonator element, or the like may be used.

Mounting Status of Rear Surface of Outer Package

Figure 7:
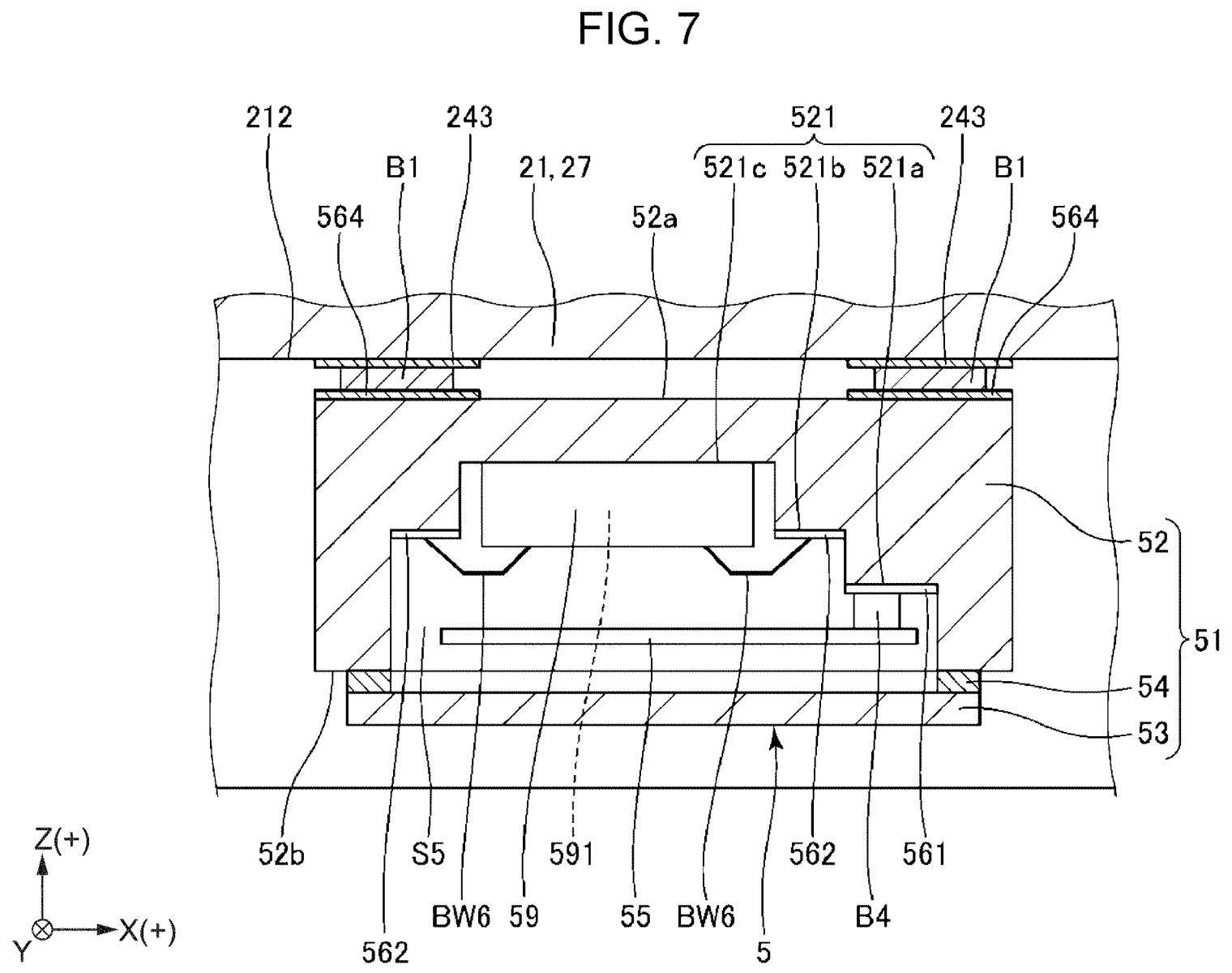
Figure 8:
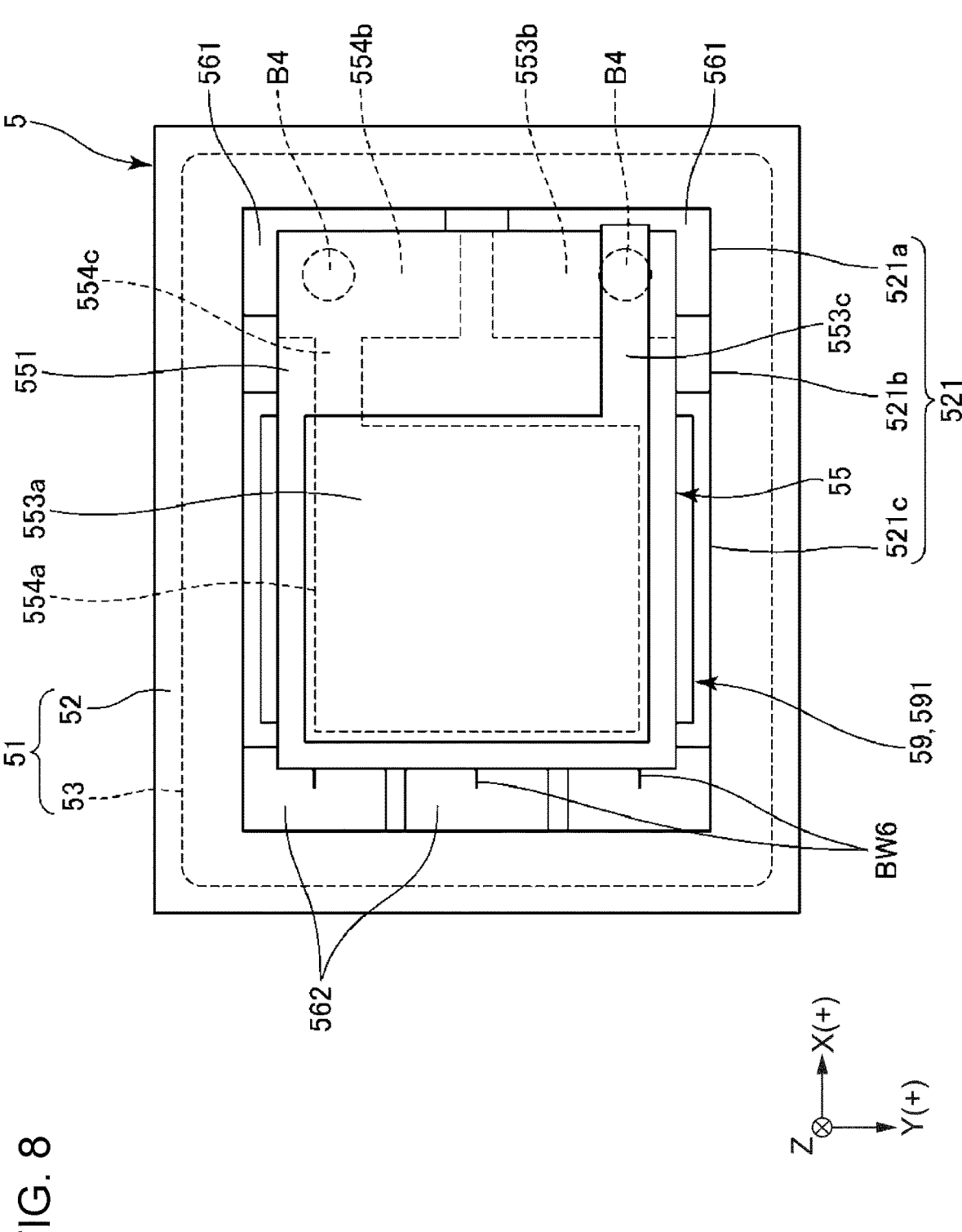
FIG. 8 is a plan view of the voltage controlled quartz crystal oscillator when viewed from the lower surface side.

FIG. 7 is a sectional view of the voltage controlled quartz crystal oscillator. FIG. 8 is a plan view of the voltage controlled quartz crystal oscillator when viewed from the lower surface side.

The voltage controlled quartz crystal oscillator 5 is an oscillator included in a PLL circuit 42 (FIG. 9) described later.

As illustrated in FIG. 7, the voltage controlled quartz crystal oscillator 5 has a package 51, and the resonator element 55 and a circuit element 59 that are housed in the package 51.

The package 51 has a base 52 and a lid 53. The base 52 has a box shape and includes a recess 521 that is open on a lower surface 52b. The lid 53 has a plate shape and is bonded to the lower surface 52b of the base 52 via a sealing member 54 such as a seal ring or low-melting-point glass so as to close the opening of the recess 521. The recess 521 is thereby airtightly sealed to form a housing space S5 in the package 51. The resonator element 55 and the circuit element 59 are housed in the housing space S5.

Note that although constituent materials of the base 52 and the lid 53 are not particularly limited, for example, the base 52 may be formed of a variety of ceramic materials such as alumina or titania, and the lid 53 may be formed of a variety of metal materials such as Kovar. Thus, the package 51 is made tough and excellent in mechanical strength. Further, it is possible to make the both components approximately equal in linear expansion coefficient, and it is also possible to achieve reduction in thermal stress caused in the package 51. Accordingly, it becomes difficult for the stress to be applied to the resonator element 55, and thus, the vibration characteristics of the resonator element 55 stabilize.

The housing space S5 will be described in detail. The recess 521 has a first recess 521a that is open on the lower surface 52b, a second recess 521b that is open on a bottom surface of the first recess 521a and is smaller in opening than the first recess 521a, and a third recess 521c that is open on a bottom surface of the second recess 521b and is smaller in opening than the second recess 521b. Further, the resonator element 55 is arranged on the bottom surface of the first recess 521a, and the circuit element 59 is arranged on a bottom surface of the third recess 521c. The housing space S5 is made airtight and set in a reduced-pressure state, desirably, in a state approximate to a vacuum state. Thus, a viscosity resistance in the housing space S5 decreases, and the vibration characteristics of the resonator element 55 are improved.

Further, in the base 52, there are arranged a plurality of internal terminals 561 on the bottom surface of the first recess 521a, a plurality of internal terminals 562 on the bottom surface of the second recess 521b, and a plurality of external terminals 564 on the upper surface 52a of the base 52. The internal terminals 561 are each electrically coupled to the resonator element 55 via a bonding member B4 having electrical conductivity, and the internal terminals 562 are each electrically coupled to the circuit element 59 via a bonding wire BW6. These terminals 561, 562, and 564 are electrically coupled as appropriate via interconnections (not illustrated) formed in the base 52 to electrically couple the resonator element 55, the circuit element 59, and the external terminals 564. The inside and the outside of such a package 51 are electrically coupled to each other via the external terminals 564.

The resonator element 55 illustrated in FIG. 8 is an AT cut quartz crystal resonator element.

The resonator element 55 has a quartz crystal substrate 551 having a rectangular shape cut out as an AT cut element, excitation electrodes 553a and 554a arranged opposed to each other on upper and lower surfaces of the quartz crystal substrate 551, pad electrodes 553b and 554b arranged on the upper surface of the quartz crystal substrate 551, and extraction electrodes 553c and 554c for coupling the excitation electrodes 553a and 554a and the pad electrodes 553b and 554b.

Although the resonator element 55 has been described above, the configuration thereof is not particularly limited. For example, a shape of the quartz crystal substrate 551 in plan view is not limited to the rectangular shape, and may be a circular shape, a quadrangular shape other than the rectangular shape, or other polygonal shapes. A bevel treatment for grinding an outer edge of the quartz crystal substrate 551 or a convex treatment for changing the upper surface and the lower surface of the quartz crystal substrate 551 to convex surfaces may be performed. As the resonator element 55, other piezoelectric resonator elements such as an SC cut quartz crystal resonator element, a BT cut quartz crystal resonator element, a tuning fork type quartz crystal resonator element, and a surface acoustic wave resonator, an MEMS resonator element, or the like may be used instead of the AT cut quartz crystal resonator element.

Such a resonator element 55 has an end fixed to the bottom surface of the first recess 521a via a pair of bonding members B4. The pad electrodes 553b and 554b and the respective internal terminals 561 are electrically coupled via the bonding members B4. Here, a fixation method and an electrical coupling method of the resonator element 55 are not particularly limited.

Description will be given with reference back to FIG. 7.

The circuit element 59 has an oscillation circuit 591 for oscillating the resonator element 55. Such a circuit element 59 is arranged on the bottom surface of the third recess 521c with an active surface facing downward and is electrically coupled to each of the plurality of internal terminals 562 via the bonding wire BW6.

As illustrated in FIG. 7, the voltage controlled quartz crystal oscillator 5 is fixed to the bottom surface of the lower recess 212 via the bonding member B1 having electrical conductivity. Furthermore, the external terminal 564 and the internal terminal 243 are electrically coupled to each other via the bonding member B1.

Description will be given with reference back to FIG. 1.

As illustrated in FIG. 1, the control IC 4 has a temperature controlling circuit 41 for controlling the drive of the first integrated circuit 7, a portion of the PLL circuit 42, and an output buffer circuit 43.

The temperature controlling circuit 41 is a circuit for controlling an amount of the electric current flowing through a resistor of the heat generation circuit 72 in accordance with an output signal of the temperature sensor 82 to keep the temperature of the resonator element 6 constant. For example, the temperature controlling circuit 41 performs control of making a desired electric current flow into the resistor of the heat generation circuit 72 when the current temperature determined from the output signal of the temperature sensor 82 is lower than a set reference temperature and making electric current not flow into the resistor of the heat generation circuit 72 when the current temperature is higher than the reference temperature. Furthermore, for example, the temperature controlling circuit 41 may control the amount of electric current flowing through the resistor of the heat generation circuit 72 to increase or decrease in accordance with a difference between the current temperature and the reference temperature.

Figure 9:
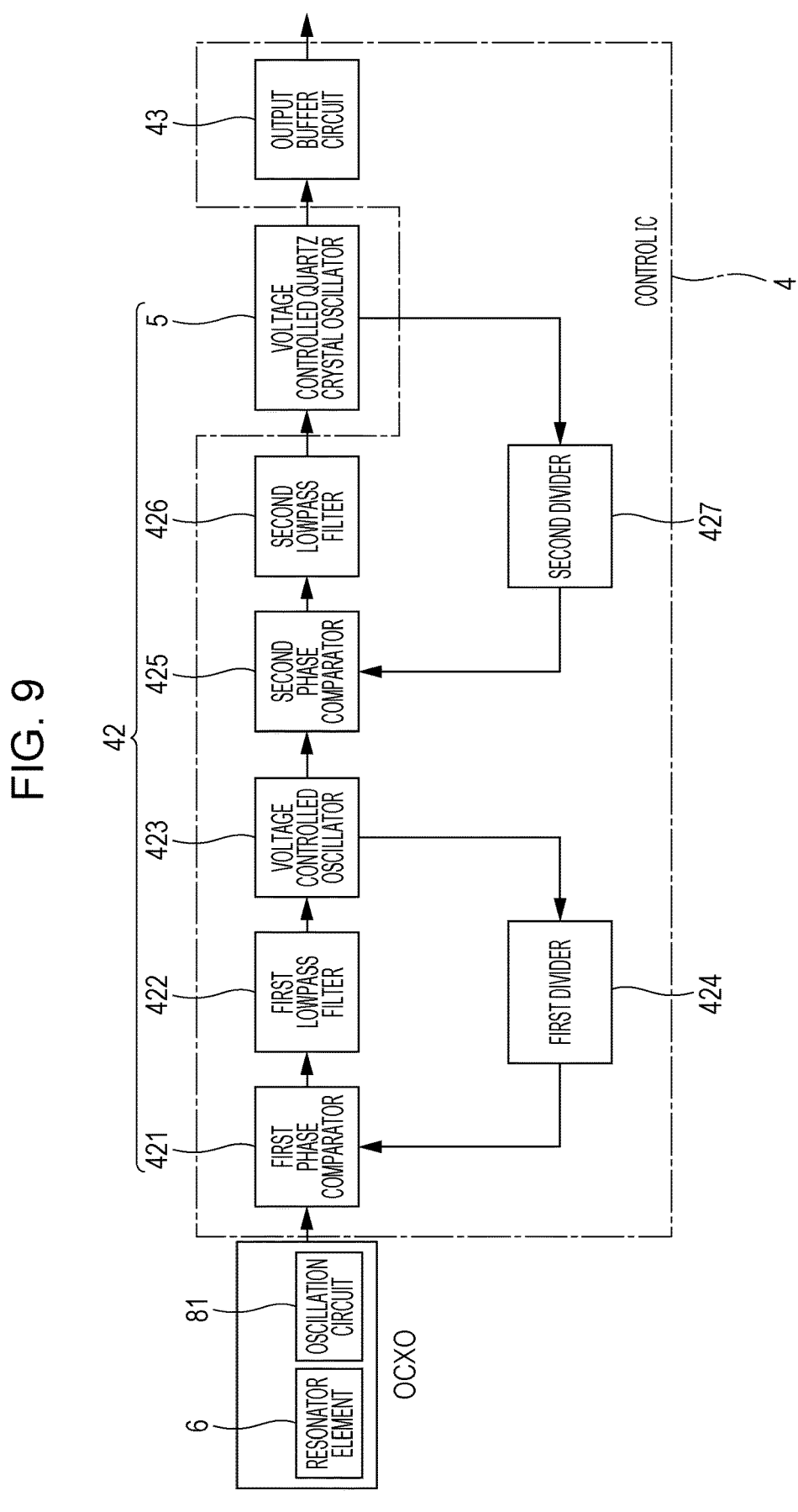
FIG. 9 is a circuit block diagram of a PLL circuit.

FIG. 9 is a circuit block diagram of the PLL circuit.

The PLL circuit 42 has a first phase comparator 421 to which a reference frequency signal as an oscillation signal output from the oscillation circuit 81 is input, a first lowpass filter 422, a voltage controlled oscillator 423 to which a direct-current signal from the first lowpass filter 422 is input, and a first divider 424 to which a frequency signal output from the voltage controlled oscillator 423 is input. The frequency signal divided by the first divider 424 is input to the first phase comparator 421. In the first phase comparator 421, a phase difference between the reference frequency signal and the frequency signal is detected and output to the first lowpass filter 422. In the first lowpass filter 422, a high frequency component is removed from the output signal from the first phase comparator 421, converted into a voltage, and output as a direct-current signal for controlling the voltage controlled oscillator 423.

Note that the first divider 424 is able to set a fractional frequency division ratio by, for example, switching between integer frequency division ratios to achieve the fractional frequency division ratio on average. Thus, the anterior portion of the PLL circuit constituted by the first phase comparator 421, the first lowpass filter 422, the voltage controlled oscillator 423, and the first divider 424 functions as a fractional frequency dividing PLL circuit (fractional PLL circuit). As a result, in the fractional frequency dividing PLL circuit, it becomes possible to output a signal with any frequency.

Furthermore, the PLL circuit 42 has a second phase comparator 425 to which a frequency signal output from the voltage controlled oscillator 423 is input, a second lowpass filter 426, the voltage controlled quartz crystal oscillator 5, and a second divider 427 to which a frequency signal output from the voltage controlled quartz crystal oscillator 5 is input. The frequency signal divided by the second divider 427 is input to the second phase comparator 425. In the second phase comparator 425, a phase difference between the frequency signal output from the voltage controlled oscillator 423 and the frequency signal divided by the second divider 427 is detected and output to the second lowpass filter 426. In the second lowpass filter 426, a high frequency component is removed from the output signal from the second phase comparator 425, converted into a voltage, and output as a direct-current signal (frequency control signal) for controlling the voltage controlled quartz crystal oscillator 5.

Note that the second divider 427 is, for example, an integer divider for performing integer frequency division on the input signal. Thus, the posterior portion of the PLL circuit constituted by the second phase comparator 425, the second lowpass filter 426, the voltage controlled quartz crystal oscillator 5, and the second divider 427 functions as an integer frequency dividing PLL circuit (integer PLL circuit). In the integer frequency dividing PLL circuit, it is possible to form a circuit relatively low in phase noise and relatively simple in circuit configuration.

Further, a frequency signal corresponding to the voltage of the direct-current signal is output from the voltage controlled quartz crystal oscillator 5 to the output buffer circuit 43. In other words, the oscillation frequency of the voltage controlled quartz crystal oscillator 5 is controlled in accordance with the reference frequency signal output from the oscillation circuit 81.

Of the circuit elements constituting the PLL circuit 42, the voltage controlled quartz crystal oscillator 5 is configured as a separated body from the control IC 4, and the other elements may be configured as separated bodies from the control IC 4. For example, the first and second lowpass filters 422 and 426 may be configured as separated bodies from the control IC 4 or may be arranged in alignment with the voltage controlled quartz crystal oscillator 5 on the bottom surface of the lower recess 212.

Figure 10:
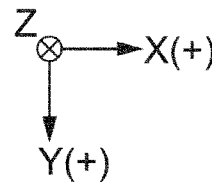
FIG. 10 is a plan view of the oscillator when viewed from the lower surface side.

FIG. 10 is a plan view of the oscillator when viewed from the lower surface side.

As illustrated in FIG. 10, the voltage controlled quartz crystal oscillator 5 is arranged on the bottom surface of the lower recess 212 and surrounded by the leg portion 29. Thus, the leg portion 29 exerts a function of a windbreak wall to make it difficult to blow a wind to the voltage controlled quartz crystal oscillator 5. Accordingly, the temperature fluctuation of the voltage controlled quartz crystal oscillator 5 due to the wind is suppressed, and it is possible to effectively suppress the deterioration of the phase noise characteristics of the output signal output from the output buffer circuit 43.

As described above, the oscillator 100 of the present embodiment is able to achieve the following effect.

The oscillator 100 includes the resonator element 6 provided with the excitation electrodes 621 and 631, the oscillation circuit 81 for oscillating the resonator element 6 to generate an oscillation signal, the temperature sensor 82 for generating a temperature signal for temperature compensation of the oscillation signal, the heat generation circuit 72 as a temperature control element for controlling temperature of the resonator element 6, and the inner package 3 as a container that houses these components. The temperature sensor 82 and the heat generation circuit 72 overlap the excitation electrodes 621 and 631 in plan view.

Thus, the temperature sensor 82 and the heat generation circuit 72 are covered by the excitation electrodes 621 and 631. The excitation electrodes 621 and 631 are arranged so as to become lids of the temperature sensor 82 and the heat generation circuit 72 and thus reflect radiant heat therefrom. This makes it possible to suppress radiant heat from being released to the outside of the inner package 3. In particular, since the two layers of the excitation electrodes 621 and 631 composed of Au electrodes are provided via the quartz crystal substrate 61, a higher heat retaining effect is exhibited compared to a single-layer configuration, and it is possible to further suppress the radiant heat from being released to the outside. Accordingly, since the heat retaining property in the inner package 3 is improved, the temperature in the inner package 3 is able to be made uniform. This makes it possible to suppress a temperature variation in the first integrated circuit 7 and the second integrated circuit 8 and thus possible to achieve good frequency characteristics. Furthermore, the improved heat retaining property is able to reduce the amount of heat generated by the heat generation circuit 72 of the first integrated circuit 7, and it is thus possible to reduce electric current consumption.

Consequently, it is possible to provide the oscillator 100 having high temperature stability and excellent frequency stability.

The oscillator 100 further includes the bonding member B2 for bonding the resonator element 6 to the inner package 3, the heat generation circuit 72 is formed in the first integrated circuit 7, the temperature sensor 82 and the oscillation circuit 81 are formed in the second integrated circuit 8, and the first integrated circuit 7 is arranged between the bonding member B2 and the second integrated circuit 8 in plan view.

Accordingly, it is possible to approximate a dimension of a heat conduction path from the heat generation circuit 72 to the resonator element 6 and a dimension of a heat conduction path from the heat generation circuit 72 to the temperature sensor 82 to each other. Thus, since the temperature detected by the temperature sensor 82 becomes substantially the same as the temperature of the resonator element 6, it is possible to accurately detect the temperature of the resonator element 6. Accordingly, the temperature of the resonator element 6 is able to be accurately controlled, and thus, the frequency characteristics stabilize.

Moreover, the temperature sensor 82 and the first integrated circuit 7 are entirely covered by the excitation electrodes 621 and 631 in plan view.

In the first integrated circuit 7, the heat generation circuit 72 mainly generates heat. The heat is transferred also to a portion around the heat generation circuit 72 and radiated from the entire first integrated circuit 7. Accordingly, covering the entire first integrated circuit 7 with the excitation electrodes 621 and 631 is able to more effectively suppress the radiant heat from being released to the outside.

Further, the first integrated circuit 7 is electrically coupled to the inner package 3 via the bonding wire BW4.

Due to coupling via the bonding wire BW4, the entire rear surface of the first integrated circuit 7 is bonded to the bottom surface of the third recess 311c of the inner package 3, and thus, the heat generated in the first integrated circuit 7 is able to be efficiently transferred to the second integrated circuit 8 and the resonator element 6 via the inner base 31.

The oscillator 100 further includes the outer package 2 as an outer container that houses the inner package 3.

Accordingly, by housing the inner package 3 in the outer package 2, it is possible to more effectively suppress the radiant heat from being released to the outside.

Embodiment 2

Another Mounting Status of Integrated Circuit

Figure 11:
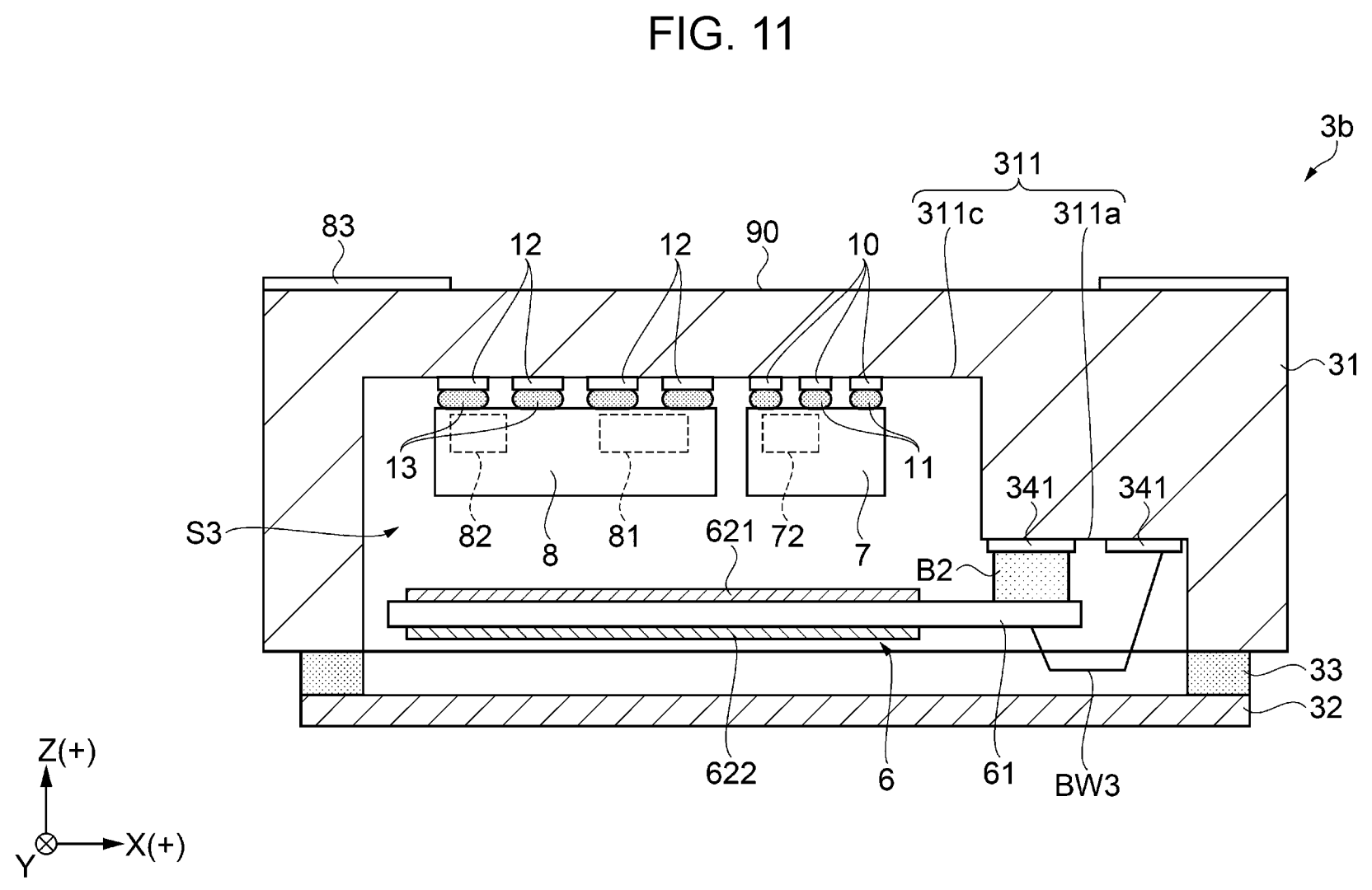
Figure 12:
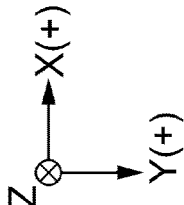
FIG. 12 is a plan view of an interior of the inner package before a resonator element is mounted.

FIG. 11 is a sectional view of an inner package according to Embodiment 2 and corresponds to FIG. 4. FIG. 12 is a plan view of an interior of the inner package before the resonator element is mounted and corresponds to FIG. 5.

In the embodiment described above, description has been given by assuming that the first integrated circuit 7 and the second integrated circuit 8 are mounted on the inner package 3 via the bonding wires BW4 and BW5, but this is not a limitation. The first integrated circuit 7 and the second integrated circuit 8 may be mounted in a face-down manner. Hereinafter, the same portion as that of the embodiment described above will be given the same reference numeral, and redundant description will be omitted.

As illustrated in FIG. 11, in an inner package 3b of the present embodiment, the first integrated circuit 7 and the second integrated circuit 8 are flip-chip mounted on the bottom surface of the third recess 311c of the inner base 31. Specifically, a plurality of mounting lands 10 are provided on the bottom surface of the third recess 311c, and the first integrated circuit 7 is electrically coupled to each of the mounting lands 10 via a bump 11 with its active surface facing in the positive Z direction. Similarly, a plurality of mounting lands 12 are provided on the bottom surface of the third recess 311c, and the second integrated circuit 8 is electrically coupled to each of the mounting lands 12 via a bump 13 with its active surface facing in the positive Z direction. In other words, the first integrated circuit 7 is flip-chip mounted on the inner package 3b. Note that the bumps 11 and 13 are Au bumps in a suitable example. Note that the bumps 11 and 13 are not limited thereto and may be any bumps as long as capable of ensuring electrical coupling, and examples thereof include solder bumps.

In the inner package 3b, since no bonding is performed, the second recess 311b (FIG. 4) in the recess 311 of the inner base 31 becomes unnecessary, so that the recess 311 has a two-stage configuration including the first recess 311a and the third recess 311c. The inner package 3b is thus lower than the inner package 3, achieving lower height.

FIG. 12 is a plan view of an interior of the inner package 3b before the resonator element 6 is mounted.

As illustrated in FIG. 12, three mounting lands 10 are separately arranged respectively along opposite sides of the first integrated circuit 7. A solid pattern 15 of a quadrangular shape is provided between three mounting lands 10 and three mounting lands 10 opposite thereto. The solid pattern 15 is an electrode pattern, has a surface on which an insulating layer is provided, and is not in contact with the active surface of the first integrated circuit 7. In a suitable example, the solid pattern 15 is electrically coupled to the GND of the first integrated circuit 7. Note that the solid pattern 15 may be floating. In other words, the inner package 3b has the solid pattern 15 that is an electrode pattern overlapping a center portion of the first integrated circuit 7 in plan view.

Similarly, four mounting lands 12 are separately arranged respectively along opposite sides of the second integrated circuit 8. A solid pattern 16 of a quadrangular shape is provided between four mounting lands 12 and four mounting lands 12 opposite thereto. The solid pattern 16 is an electrode pattern, has a surface on which an insulating layer is provided, and is not in contact with the active surface of the second integrated circuit 8. In a suitable example, the solid pattern 16 is electrically coupled to the GND of the second integrated circuit 8. Note that the solid pattern 16 may be floating.

As described above, in the inner package 3b, since no bonding is performed, the second recess 311b (FIG. 4) in the recess 311 of the inner base 31 becomes unnecessary. This enables the inner package 3b, as illustrated in FIG. 12, to have a smaller width in the Y-axis direction than that of the inner package 3.

As described above, according to the oscillator 100 including the inner package 3b of the present embodiment, it is possible to achieve the following effect in addition to the effect achieved by the embodiment described above.

According to the oscillator 100, the first integrated circuit 7 is flip-chip mounted on the inner package 3b.

Thus, since the active surface of the first integrated circuit 7 is arranged facing the third recess 311c of the inner base 31, a distance between the heat generation circuit 72 arranged on the active surface and the inner base 31 is short compared to the case of bonding mounting. Thus, since heat generated from the heat generation circuit 72 is readily transferred to the inner base 31, the heat is able to be efficiently transferred to the second integrated circuit 8 and the resonator element 6 via the inner base 31. Accordingly, it is possible to suppress a temperature variation in the first integrated circuit 7 and the second integrated circuit 8 and thus possible to achieve good frequency characteristics.

Consequently, it is possible to provide the oscillator 100 having high temperature stability and excellent frequency stability.

Further, the inner package 3b has the solid pattern 15 that is an electrode pattern overlapping a center portion of the first integrated circuit 7 in plan view.

Thus, the solid pattern 15 is arranged so as to cover the center portion of the first integrated circuit 7 and thus reflects the radiant heat from the first integrated circuit 7. This makes it possible to suppress the radiant heat from being released to the outside of the inner package 3b. In particular, the solid pattern 15 covers the heat generation circuit 72 and thus has a great effect of suppressing radiant heat from being released.

Embodiment 3

Another Mounting Status of Resonator Element

Figure 13:
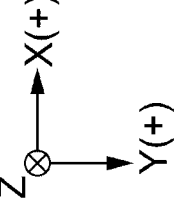
FIG. 13 is a plan view of an interior of an inner package after a resonator element according to Embodiment 3 is mounted.

FIG. 13 is a plan view of an interior of an inner package after a resonator element according to Embodiment 3 is mounted and correspond to FIG. 6. FIG. 13 selectively illustrates a status where a resonator element 6b overlaps the first integrated circuit 7 and the second integrated circuit 8.

In the embodiment described above, description has been given by assuming that the quartz crystal substrate 61 and the excitation electrodes 621 and 631 have a quadrangular shape, but the shape is not limited thereto and may be a polygonal shape or an elliptical shape. Hereinafter, the same portion as that of the embodiment described above will be given the same reference numeral, and redundant description will be omitted.

As illustrated in FIG. 13, a quartz crystal substrate 61b of a resonator element 6b according to the present embodiment has a hexagonal shape. Specifically, two apex portions of a quadrangular shape in the negative X direction are chamfered to form the hexagonal shape. Accordingly, excitation electrodes 621b and 631b each also have a hexagonal shape by chamfering two apex portions in the negative X direction.

Note that a bevel treatment for grinding an outer edge of the quartz crystal substrate 61b or a convex treatment for changing the upper surface and the lower surface of the quartz crystal substrate 61b to convex surfaces may be performed.

In a suitable example, as illustrated in FIG. 13, the first integrated circuit 7 and the second integrated circuit 8 are entirely covered by the excitation electrodes 621b and 631b. Note that the excitation electrodes 621b and 631b may have a polygonal shape, a circular shape, or an elliptical shape and are required only to be arranged so as to overlap at least the heat generation circuit 72 and the temperature sensor 82. Even such a configuration is able to achieve a similar operation effect to that of each of the embodiments described above.

Moreover, description has been given above by assuming that the first integrated circuit 7 and the second integrated circuit 8 are constituted by two chips, but the configuration is not limited thereto, and the first integrated circuit 7 and the second integrated circuit 8 may be constituted by one chip. Also in this case, at least one of the excitation electrodes 621b and 631b is required only to be arranged so as to overlap the heat generation circuit 72 and the temperature sensor 82. Even such a configuration is able to achieve a similar operation effect to that of each of the embodiments described above.

What is claimed is:

1. An oscillator comprising:
   a resonator element provided with an excitation electrode;
   an oscillation circuit for oscillating the resonator element to generate an oscillation signal;
   a temperature sensor for generating a temperature signal for temperature compensation of the oscillation signal;
   a temperature control element for controlling temperature of the resonator element;
   a container that houses the resonator element, the oscillation circuit, the temperature sensor, and the temperature control element; and
   a bonding portion for bonding the resonator element to the container, wherein
   the temperature sensor and the temperature control element overlap the excitation electrode along a first direction in a plan view, and
   the bonding portion is not overlapped with the oscillation circuit along the first direction in the plan view.

2. The oscillator according to claim 1, wherein
   the temperature control element is formed in a first integrated circuit, the temperature sensor and the oscillation circuit are formed in a second integrated circuit, and
   the first integrated circuit is arranged between the bonding portion and the second integrated circuit in the plan view.

3. The oscillator according to claim 2, wherein
   the temperature sensor and the first integrated circuit are entirely covered by the excitation electrode in the plan view.

4. The oscillator according to claim 2, wherein
   the first integrated circuit is electrically coupled to the container via a bonding wire.

5. The oscillator according to claim 2, wherein
   the first integrated circuit is flip-chip mounted on the container.

6. The oscillator according to claim 5, wherein
   the container has an electrode pattern overlapping a center portion of the first integrated circuit in the plan view.

7. The oscillator according to claim 1, further comprising an outer container that houses the container.

\* \* \* \* \*